United States Patent
Hyun

(10) Patent No.: US 8,058,160 B2
(45) Date of Patent: Nov. 15, 2011

(54) METHOD OF FORMING NONVOLATILE MEMORY DEVICE

(75) Inventor: Chan Sun Hyun, Icheon-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/816,855

(22) Filed: Jun. 16, 2010

(65) Prior Publication Data

US 2010/0330789 A1  Dec. 30, 2010

(30) Foreign Application Priority Data

Jun. 25, 2009  (KR) .................. 10-2009-0057125

(51) Int. Cl.
  *H01L 21/3205* (2006.01)
(52) U.S. Cl. ........ 438/587; 438/128; 438/257; 438/589; 257/E21.179; 257/E21.532; 257/E21.662
(58) Field of Classification Search ................ 438/206, 438/599, 707; 257/E21.179, E21.532, E21.533, 257/E21.613, E21.662
See application file for complete search history.

(56) References Cited

U.S. PATENT DOCUMENTS

| | | | | |
|---|---|---|---|---|
| 6,171,939 B1 * | 1/2001 | Lin | ............................... | 438/585 |
| 6,228,712 B1 * | 5/2001 | Kawai et al. | .................. | 438/257 |
| 2007/0099380 A1 * | 5/2007 | Kim | ............................. | 438/257 |

FOREIGN PATENT DOCUMENTS

| KR | 10-2006-0000793 | 1/2006 |
|---|---|---|
| KR | 1020060029382 | 4/2006 |
| KR | 10-2008-0022398 | 3/2008 |
| KR | 10-2008-0061518 | 7/2008 |
| KR | 1020080064306 | 7/2008 |
| KR | 1020090000399 | 1/2009 |

\* cited by examiner

*Primary Examiner* — Cheung Lee
(74) *Attorney, Agent, or Firm* — Marshall, Gerstein & Borun LLP

(57) ABSTRACT

A method of forming the gate patterns of a nonvolatile memory device comprises stacking a gate insulating layer and a first conductive layer over a semiconductor substrate; forming isolation hard mask patterns over the first conductive layer; etching the first conductive layer using the isolation hard mask patterns as etch barriers, thus exposing the gate insulating layer; etching the gate insulating layer using the isolation hard mask patterns as etch barriers, thus exposing the semiconductor substrate; after exposing the semiconductor substrate, forming a passivation layer on the sidewalls of the first conductive layers and on the sidewalls of the gate insulating layers; and etching the semiconductor substrate using the passivation layer and the isolation hard mask patterns as etch barriers, thus forming trenches in the semiconductor substrate.

11 Claims, 5 Drawing Sheets

METHOD OF FORMING NONVOLATILE MEMORY DEVICE

CROSS-REFERENCE TO RELATED APPLICATION

Priority to Korean patent application number 10-2009-0057125 filed on Jun. 25, 2009, the entire disclosure of which is incorporated by reference herein, is claimed.

BACKGROUND

An exemplary embodiment relates generally to a method of manufacturing a nonvolatile memory device and, more particularly, to a method of forming a nonvolatile memory device that is capable of preventing damage to gate patterns in a process of forming trenches.

A nonvolatile memory device includes a memory cell array area and a peripheral area. A number of string structures are formed in the memory cell array area. Each of the string structures includes a number of memory cells coupled in series between a source select transistor and a drain select transistor and configured to store data. The string structures are spaced apart from each other with an isolation layer interposed therebetween. The isolation layer is formed in the isolation area of a semiconductor substrate. In the peripheral area are formed circuit elements, such as a power source circuit and a control circuit for controlling the program, erase, and read operations of a memory cell. The circuit elements further include a low-voltage or high-voltage NMOS transistor and a PMOS transistor.

In a NAND flash memory device advantageous for a high degree of integration, the gate patterns of memory cells include polysilicon layers used as charge trap layers. The polysilicon layers used as the charge trap layers are formed as patterns separated from each other for every memory cell. To form the polysilicon layers in the form of patterns separated from each other for every memory cell, a trench formation process of defining areas in which the isolation layers will be formed can be used. If, as described above, the polysilicon layers used as the charge trap layers are patterned using the trench formation process, there is an advantage in that error occurring when the charge trap layers and the isolation areas are aligned can be improved. The method of patterning the polysilicon layers, used as the charge trap layers, using the trench formation process is described below with reference to FIG. 1.

FIG. 1 is a cross-sectional view of the memory cell array area and the peripheral area of a nonvolatile memory device. In particular, FIG. 1 shows part of an area in which memory cells is formed, from among a memory cell array area and part of an area in which a high-voltage circuit element is formed, from among a peripheral area.

Referring to FIG. 1, a number of the memory cells and circuit elements are formed over the active areas of a semiconductor substrate 11, defined by trenches 19. The trenches 19 are formed by etching the semiconductor substrate 11 and are configured to define isolation areas and the active areas. The isolation area is an area in which the trench 19 has been formed and an isolation layer will be formed in a subsequent process. The active area is an area in which the trench 19 has not been formed. Thus, the active areas are separated from each other with the trench 19 interposed therebetween and defined between the trenches 19 in parallel to the trenches 19.

A process of forming the trenches 19 is described in detail below. First, a gate insulating layer 13, a polysilicon layer 15 for a charge trap layer, and an isolation hard mask pattern 17 are stacked over the semiconductor substrate 11. The polysilicon layer 15, the gate insulating layer 13, and, the semiconductor substrate 11 are sequentially etched by an etch process using the isolation hard mask pattern 17 as an etch barrier. The trench 19 is formed in an opened area between isolation hard mask patterns 17 of the semiconductor substrate 11. The polysilicon layer 15 and the gate insulating layer 13 remain in an area between the semiconductor substrate 11 and the isolation hard mask pattern 17.

The etch process using the isolation hard mask pattern 17 as an etch barrier can be simultaneously performed on the peripheral area and the memory cell array area. In the process of etching the semiconductor substrate 11 using the isolation hard mask pattern 17 as the etch barrier, the sidewalls of the polysilicon layer 15 are already exposed. Accordingly, an etchant used when the semiconductor substrate 11 is used can infiltrate into the polysilicon layer 15, and so the sidewalls X of the polysilicon layer 15 can be etched. The excessive etch of the sidewalls X of the polysilicon layer 15 results in device failure.

BRIEF SUMMARY

An exemplary embodiment relates to a method of forming a nonvolatile memory device, which is capable of preventing the sidewalls of a gate patterns from being excessively etched.

A method of forming a nonvolatile memory device according to an aspect of the disclosure comprises forming a gate insulating layer over a semiconductor substrate; forming conductive patterns over the gate insulating layer; removing the gate insulating layer exposed between the conductive patterns; and forming a passivation layer on the sidewalls of the conductive patterns and on the sidewalls of the remaining gate insulating layers.

The method preferably further comprises forming a passivation layer on the sidewalls of the conductive patterns, before removing the gate insulating layer. The damaged portions of the passivation layer formed before removing the gate insulating layer are compensated for by the passivation layer formed after removing the gate insulating layer.

The gate insulating layer preferably is removed using an etchant comprising $CHF_3$ and $CF_4$.

The passivation layer preferably is formed by an oxidization process, which preferably is performed at a temperature in a range of 200° C. to 300° C.

The passivation layer preferably is formed using $O_2$ gas or a mixed gas of $O_2$ and $N_2$ gases.

The conductive patterns preferably are formed by stacking and patterning an undoped polysilicon layer and a doped polysilicon layer.

The method preferably further comprises forming trenches by etching part of the semiconductor substrate between the conductive patterns after forming the passivation layer.

The passivation layer preferably is formed to a thickness that is between 20 Å and 50 Å. The thickness preferably is at least 20 Å so that the conductive patterns can be prevented from being etched during the time in which the semiconductor substrate is etched. The thickness preferably is 50 Å or less so that deterioration of an electrical characteristic of the conductive patterns can be prevented during the time in which an oxidization process of forming the passivation layer is performed.

The floating gates of the flash memory device preferably are formed using the conductive patterns.

A method of forming the nonvolatile memory device according to another aspect of the disclosure comprises forming a gate insulating layer over a semiconductor substrate;

forming conductive patterns over the gate insulating layer; removing the gate insulating layer exposed between the conductive patterns; forming a passivation layer on sidewalls of the gate insulating layer remaining beneath the conductive patterns and on sidewalls of the conductive patterns; and forming trenches by etching the semiconductor substrate between the conductive patterns.

During the time for which the semiconductor substrate is etched, the passivation layer preferably is removed to expose the semiconductor substrate, and the semiconductor substrate exposed by removing the passivation layer preferably is etched to round top edges of the trenches.

The semiconductor substrate preferably comprises a memory cell array area and a peripheral area. The gate insulating layer preferably is thicker in the top surface of the peripheral area than in the top surface of the memory cell array area. When the gate insulating layer is removed, the thickness of the gate insulating layer formed over the peripheral area preferably is used as a target.

The passivation layer preferably is formed using an oxidization process, which preferably is performed at a temperature in a range of 200° C. to 300.

The passivation layer preferably is formed using $O_2$ gas or a mixed gas of $O_2$ and $N_2$.

After forming the trenches, forming a sidewall oxide layer on the surface of the trenches preferably is further performed using an oxidization process to remove defects occurred in the sidewalls of the trenches. During the time for which the oxidization process for forming the sidewall oxide layer is performed, the thickness of edges of the gate insulating layer preferably is thickened.

The passivation layer preferably is formed to a thickness of 20 Å or more so that the conductive patterns can be prevented from being etched, during the time for which the semiconductor substrate is etched, and preferably is formed to a thickness of 50 Å or less to prevent deterioration of an electrical characteristic of the conductive patterns during the time for which an oxidization process of forming the passivation layer is performed.

DESCRIPTION OF EMBODIMENT

Figure 1:
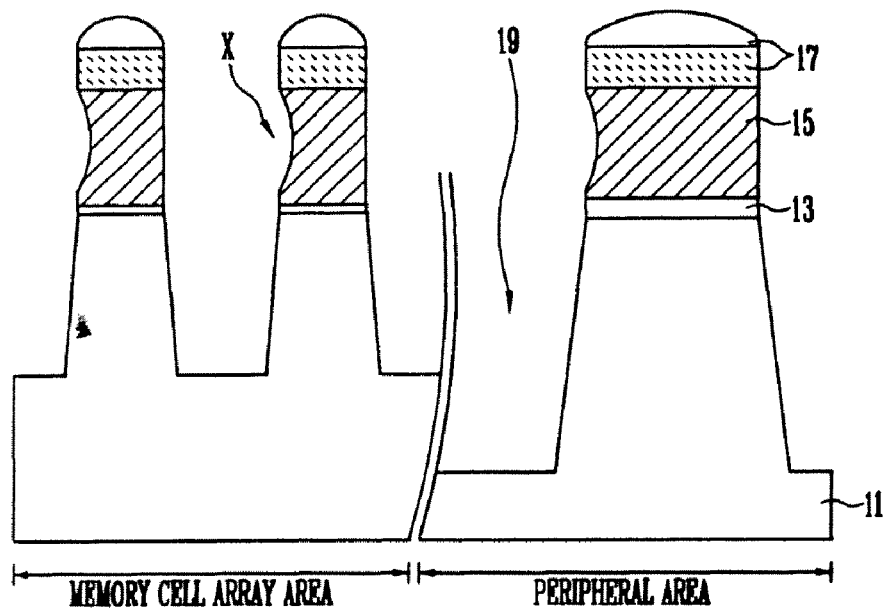
FIG. 1 is a cross-sectional view of the memory cell array area and the peripheral area of a nonvolatile memory device.

Hereinafter, an exemplary embodiment of the disclosure is described in detail with reference to the accompanying drawings. The drawing figures are provided to allow those having ordinary skill in the art to understand the scope of the embodiment of the disclosure.

FIGS. 2A to 2H are cross-sectional views illustrating a method of forming gate patterns of a nonvolatile memory device according to this disclosure.

The nonvolatile memory device includes a memory cell array area and a peripheral area. In the memory cell array area are formed memory cells for storing data. In the peripheral area are formed circuit elements, such as a power source supply circuit and a control circuit for controlling the program, erase, and read operations of the memory cells.

Figure 2A:
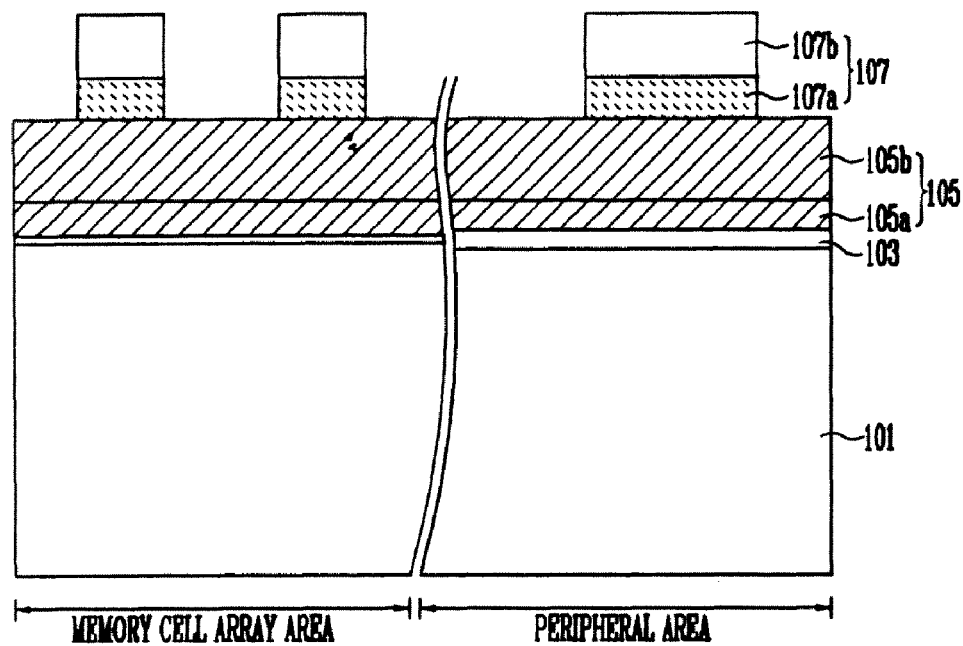
FIGS. 2A to 2H are cross-sectional views illustrating a method of forming gate patterns of a nonvolatile memory device according to this disclosure.

Referring to FIG. 2A, a well (not shown) is formed. A gate insulating layer 103 and a first conductive layer 105 are stacked over a semiconductor substrate 101 on which an ion implantation process for controlling a threshold voltage has been performed.

The gate insulating layer 103 includes an oxide layer, which can be formed using a first oxidization process or a deposition process, for example. Meanwhile, the gate insulating layer 103 preferably is thicker in part of the peripheral area than in the memory cell array area. The portion of the peripheral area in which the thickness of the gate insulating layer 103 is relatively thick is a portion in which a high-voltage circuit element (e.g., a high-voltage NMOS transistor) driven by a higher voltage as compared with the memory cells is formed. Although not shown, the thickness of the gate insulating layer 103 in a portion of the peripheral area in which a low-voltage circuit element (e.g., a low-voltage PMOS transistor or a low-voltage NMOS transistor), driven by a lower voltage as compared with the high-voltage circuit element, is formed preferably is thinner than the thickness of the gate insulating layer 103 in the portion of the peripheral area in which the high-voltage circuit element (e.g., a high-voltage NMOS transistor) is formed.

The first conductive layer 105 is a floating gate layer used as a charge trap layer and preferably is formed by stacking an undoped polysilicon layer 105a and a doped polysilicon layer 105b.

Isolation hard mask patterns 107 are formed on the first conductive layer 105. Each of the isolation hard mask patterns 107 preferably has a stack structure of an auxiliary layer 107a and a hard mask layer 107b. The auxiliary layer 107a functions to prevent the top surface of the first conductive layer 105 from being oxidized in a subsequent oxidization process, and preferably is formed using a nitride layer. The hard mask layer 107b functions as an etch barrier when the first conductive layer 105 is subsequently etched, and preferably is formed using SiON. The isolation hard mask patterns 107 preferably are formed through a patterning process using a photoresist pattern (not shown), preferably formed using a photolithography process, as an etch barrier. More particularly, after the auxiliary layer 107a and the hard mask layer 107b are stacked over the first conductive layer 105, the photoresist pattern is formed on the hard mask layer 107b. The hard mask layer 107b and the auxiliary layer 107a are sequentially etched using the photoresist pattern as the etch barrier, thereby forming the isolation hard mask patterns 107. Next, the photoresist pattern is removed.

Figure 2B:
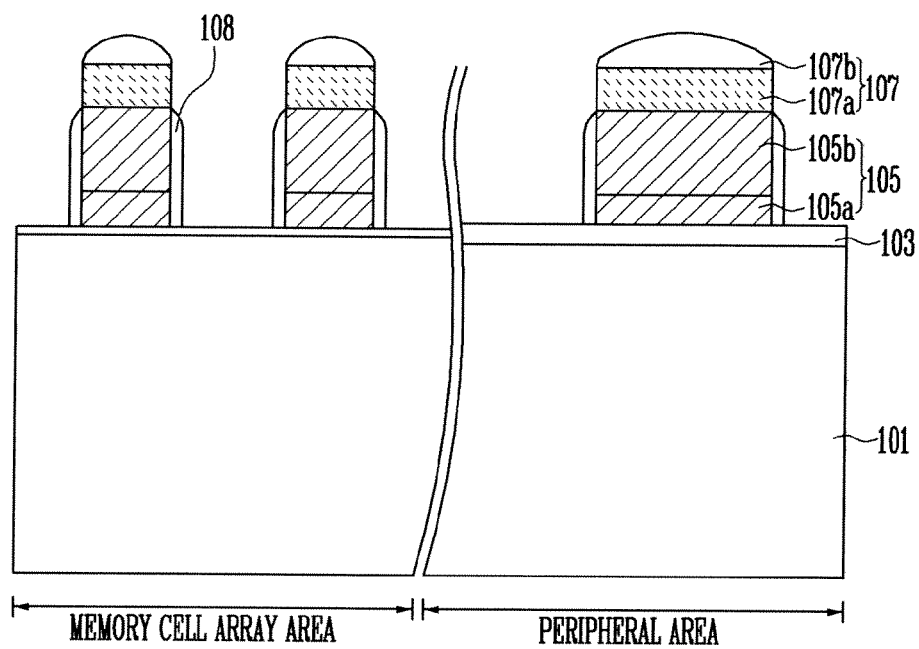

Referring to FIG. 2B, the first conductive layer 105 is etched through a first etch process using the isolation hard mask patterns 107 as an etch barrier. The first etch process is performed so that the gate insulating layer 103 is exposed in the memory cell array area and the peripheral area. Accordingly, the sidewalls of the first conductive layer 105 are exposed, and so the first conductive layer 105 is separated into a number of patterns respectively defined by the isolation hard mask patterns 107.

After the first etch process is performed, a second oxidization process is performed to form a first passivation layer 108 on the sidewalls of the first conductive layer 105. The thickness of the first passivation layer 108 formed by the second oxidization process preferably is thinner than the thickness of the gate insulating layer 103 of the memory cell array area and a high voltage element in order to guarantee the electrical characteristics of the device.

Figure 2C:
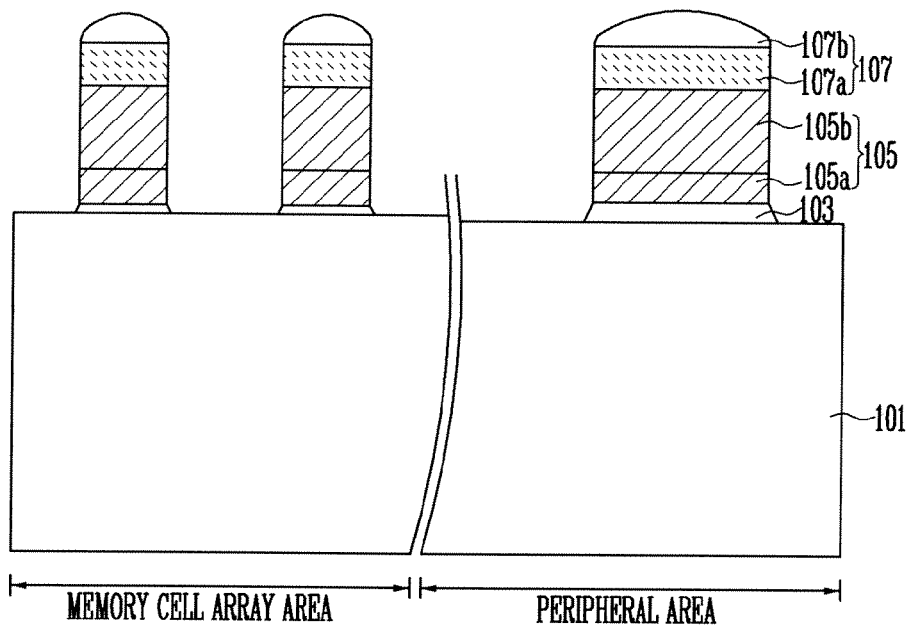

Referring to FIG. 2C, the gate insulating layer 103 in the memory cell array area and the peripheral area is etched through a second etch process using the isolation hard mask patterns 107 as etch barriers, thereby exposing the semiconductor substrate 101. Accordingly, the sidewalls of the gate insulating layer 103 are exposed, and the gate insulating layer 103 is separated into a number of the patterns respectively defined by the isolation hard mask patterns 107. That is, the first conductive layer 105 and the gate insulating layer 103 are sequentially etched using the isolation hard mask patterns 107 as the etch barriers, thereby forming a number of stack patterns in each of which the stack structure of the gate insulating layer 103 and the first conductive layer 105 is defined by each of the isolation hard mask patterns 107.

The second etch process preferably is performed using the relatively large thickness of the gate insulating layer 103 as an etch target. Here, the gate insulating layer 103 in the memory cell array area preferably is removed earlier than the gate insulating layer 103 of a relatively thick thickness, preferably formed in the portion of the peripheral area in which the high-voltage circuit element is formed. Accordingly, the semiconductor substrate 101 in the memory cell array area preferably is first exposed. The semiconductor substrate 101 exposed in the memory cell array area can be etched during the time for which the gate insulating layer 103 formed in the portion of the peripheral area in which the high-voltage circuit element is formed is etched. If, as described above, the semiconductor substrate 101 is etched during the time for which the gate insulating layer 103 is etched, the trenches formed in the semiconductor substrate 101 can have different depths in a subsequent process. To minimize a difference between the depths of the trenches, the second etch process preferably is performed using material having a high etch selectivity for an oxide layer to polysilicon. The material having a high etch selectivity for an oxide layer to polysilicon preferably includes a mixed gas of $CHF_3$ and $CF_4$.

Meanwhile, when the second etch process is performed, the first passivation layer can be removed, preferably by fluorine (F) included in $CHF_3$ and $CF_4$. Consequently, the sidewalls of the first conductive layer 105 can be excessively etched in a subsequent process of etching the semiconductor substrate 101 because they are not protected by the passivation layer. In the disclosure, with consideration taken of the above problem, the gate insulating layer 103 is first etched and a second passivation layer is then formed. The second passivation layer of the disclosure is described in detail below with reference to FIG. 2D.

Figure 2D:
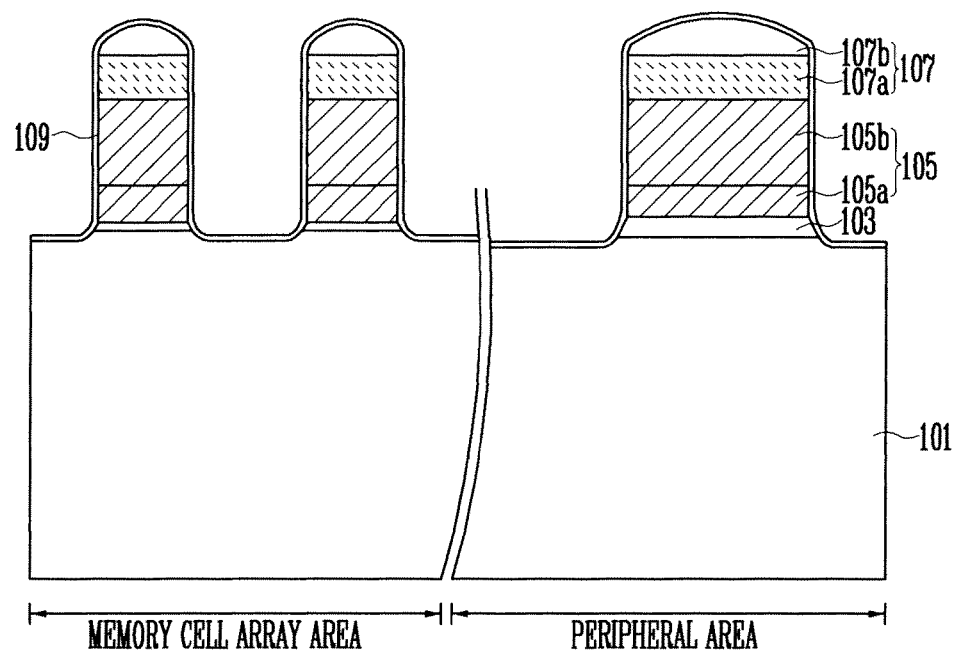

Referring to FIG. 2D, the semiconductor substrate 101 is exposed through the second etch process. Next, the second passivation layer 109 is formed on a surface of the semiconductor substrate 101, including the stack patterns each having the stack structure of the gate insulating layer 103 and the first conductive layer 105. The second passivation layer 109 can be formed through a third oxidization process.

The third oxidization process for forming the second passivation layer 109 preferably is performed at a temperature in a range of 200° C. to 300° C. The third oxidization process for forming the second passivation layer 109 preferably is performed using $O_2$ gas or a mixed gas of $O_2$ and $N_2$. If the second passivation layer 109 is formed using the mixed gas of $O_2$ and $N_2$, the efficiency of the third oxidization process can be increased because of the $N_2$ gas.

In the disclosure, after the second etch process for separating the gate insulating layer 103 into a number of the patterns is performed, the third oxidization process for forming the second passivation layer 109 is performed. Accordingly, the second passivation layer 109 can also be formed on the sidewalls of the gate insulating layer 103. Furthermore, a phenomenon in which the leakage current is generated occurs because the edges of the gate insulating layer 103 are lost in a subsequent process of etching the semiconductor substrate 101, thereby thinning the edges of the gate insulating layer 103, can be prevented. As described above, in accordance with this disclosure, since the leakage current occurring because the edges of the gate insulating layer 103 become thin can be prevented, deterioration in the data retention characteristic of the gate insulating layer 103 used as a tunnel dielectric layer in the memory cell array area can be prevented. Here, the thickness of the second passivation layer 109 can become large with the time taken for the third oxidization process to be executed increasing. The thickness of the second passivation layer 109 preferably is 20 Å or more so that the sidewalls of the first conductive layer 105 can be protected in a subsequent process of etching the semiconductor substrate 101. The sidewalls of the first conductive layer 105 used as the charge trap layer can be oxidized through the third oxidization process for forming the second passivation layer 109. To prevent the sidewalls of the first conductive layer 105 from being excessively oxidized, to prevent electrical characteristics of the first conductive layer 105 from deteriorating and to guarantee device characteristics, the thickness of the second passivation layer 109 preferably is 50 Å or less.

In the case in which, as described above, the time taken for the third oxidization process to be executed is controlled in order for the second passivation layer 109 to have an adequate thickness, the top edges of the trench can be rounded in a subsequent process. The round processing for the top edges of the trench is described later with reference to FIG. 2G.

Figure 2E:
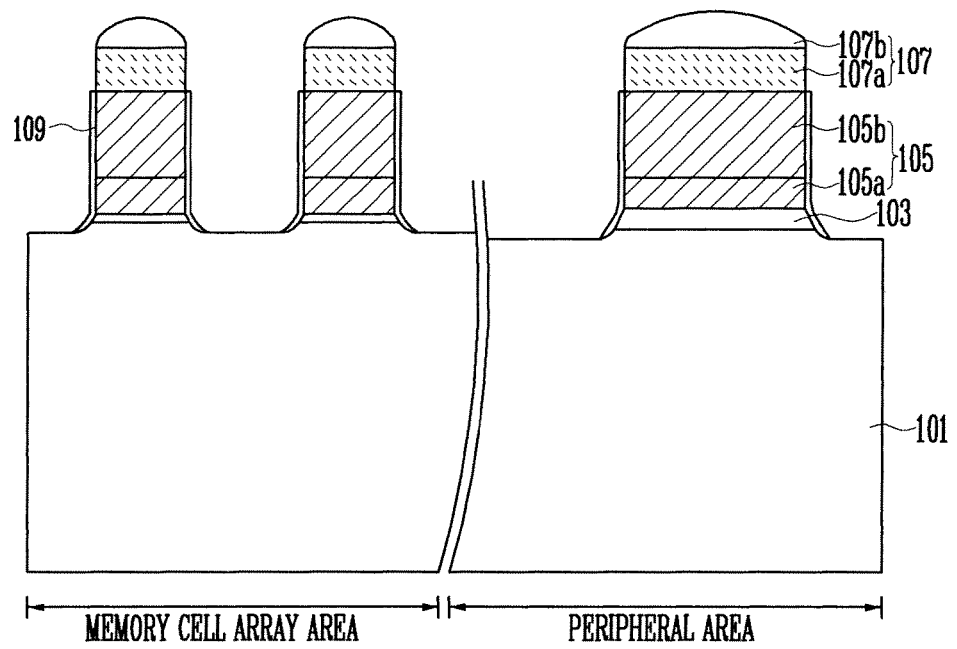

Referring to FIG. 2E, before the semiconductor substrate 101 is etched after the second passivation layer 109 is formed, a cleaning process is performed. Consequently, the second passivation layer 109 is removed from the top surface of the semiconductor substrate 101, thereby exposing the semiconductor substrate 101. Furthermore, the second passivation layer 109 remains on the sidewalls of the stack patterns, each having the stack structure of the gate insulating layer 103 and the first conductive layer 105. Accordingly, the sidewalls of the gate insulating layer 103 and the sidewalls of the first conductive layer 105 can be protected by the second passivation layer 109.

Figure 2F:
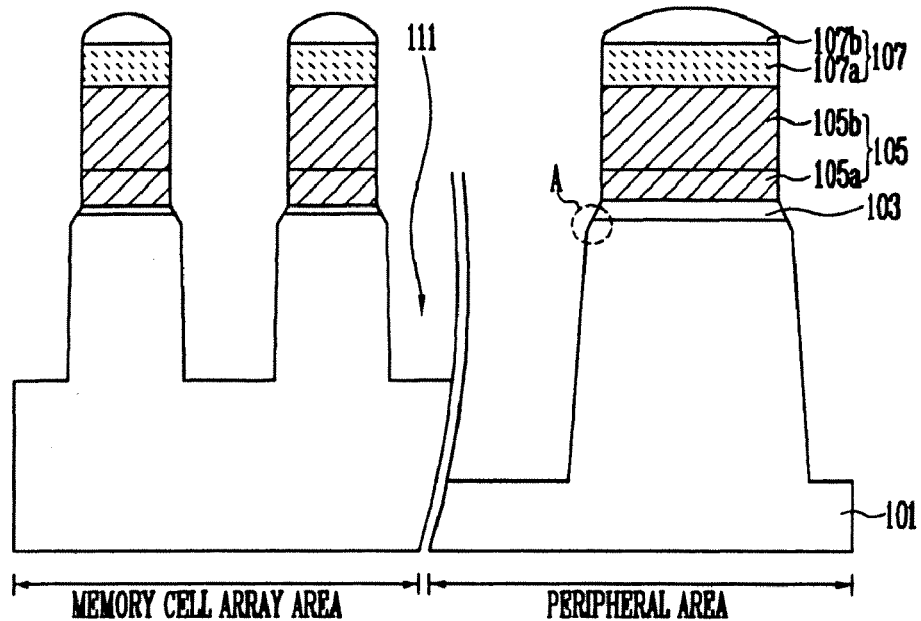

Referring to FIG. 2F, the semiconductor substrate 101 is etched through a third etch process using the isolation hard mask patterns 107 as etch barriers. Thus, trenches 111 defining isolation areas and active areas are formed in the semiconductor substrate 101.

The isolation area is an area in which the trench 111 has been formed and an isolation layer will be formed in a subsequent process. The active area is an area in which the trench 111 has not been formed. The second passivation layer 109 functions as an etch barrier for protecting the sidewalls of the first conductive layer 107 and the sidewalls of the gate insulating layer 103 during the time for which the third etch process for forming the trenches 111 is performed. Accordingly, in the disclosure, the second passivation layer 109 can prevent not only the sidewalls of the first conductive layer 107 from being excessively etched, but also the sidewalls of the gate insulating layer 103 from being etched. Consequently, in this disclosure, the second passivation layer 109 can prevent a device failure occurring due to the excessively etched sidewalls of the first conductive layer 107. Furthermore, the second passivation layer 109 can improve the leakage current, occurring because the sidewalls of the gate insulating layer 103 are etched and so the edges of the gate insulating layer 103 become thin.

During the time for which the third etch process for forming the trenches 111 is performed, the second passivation layer 109 is etched, and so the underlying semiconductor substrate 101 is exposed. Consequently, during the time for which the third etch process of forming the trenches 111 is performed, a pointed top edge of the trenches 111 is exposed.

Meanwhile, the third etch process is performed, typically using plasma. During the time for which the third etch process using plasma is performed, plasma is chiefly concentrated on the pointed top edge. Accordingly, the top edge A of the trench 111, finally formed, becomes round. Since the top edge A of the trench 111 becomes round, a phenomenon in which an electric field is concentrated on the top edge A of the trench 111 when the semiconductor device is operated can be improved.

Figure 2G:
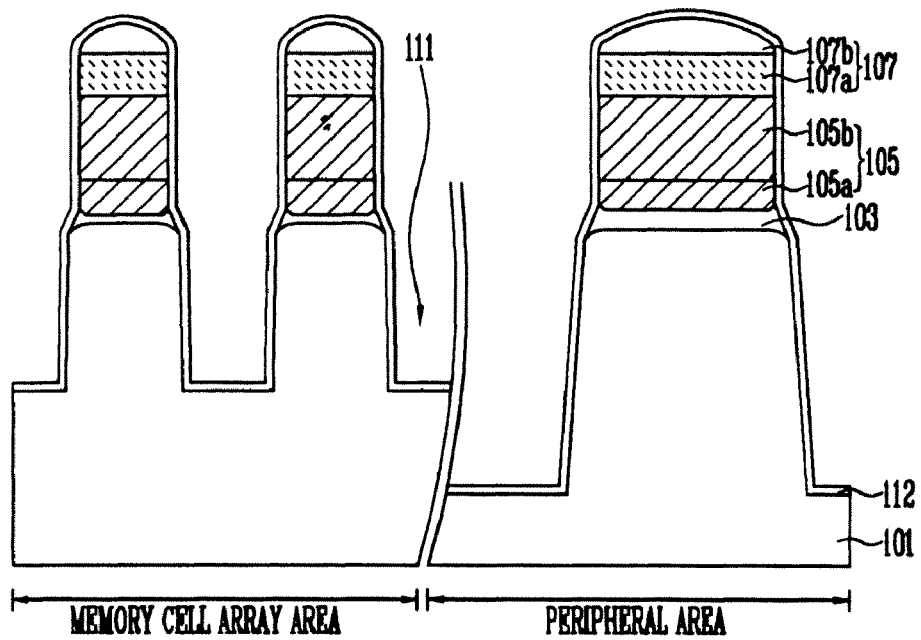

Referring to FIG. 2G, after the trenches 111 are formed, a fourth oxidization process is performed in order to form a sidewall oxide layer 112 on an exposed surface of the gate insulating layer 103, the first conductive layer 105, and the isolation hard mask patterns 107, including the surface of the semiconductor substrate 101 exposed through the trenches 111. The sidewall oxide layer 112 can compensate for defects occurred in the sidewalls of the trenches 111 during the third etch process for forming the trenches 111.

Meanwhile, during the third oxidization process for forming the sidewall oxide layer 112, the top edges of the trench 111 which have been rounded are oxidized, and so the thickness of an oxide layer formed at the edges of the gate insulating layer 103 is compensated for. Accordingly, the leakage current occurring at the edges of the gate insulating layer 103 can be improved. Consequently, deterioration in the data retention characteristic, caused through the leakage current, can be prevented.

Figure 2H:
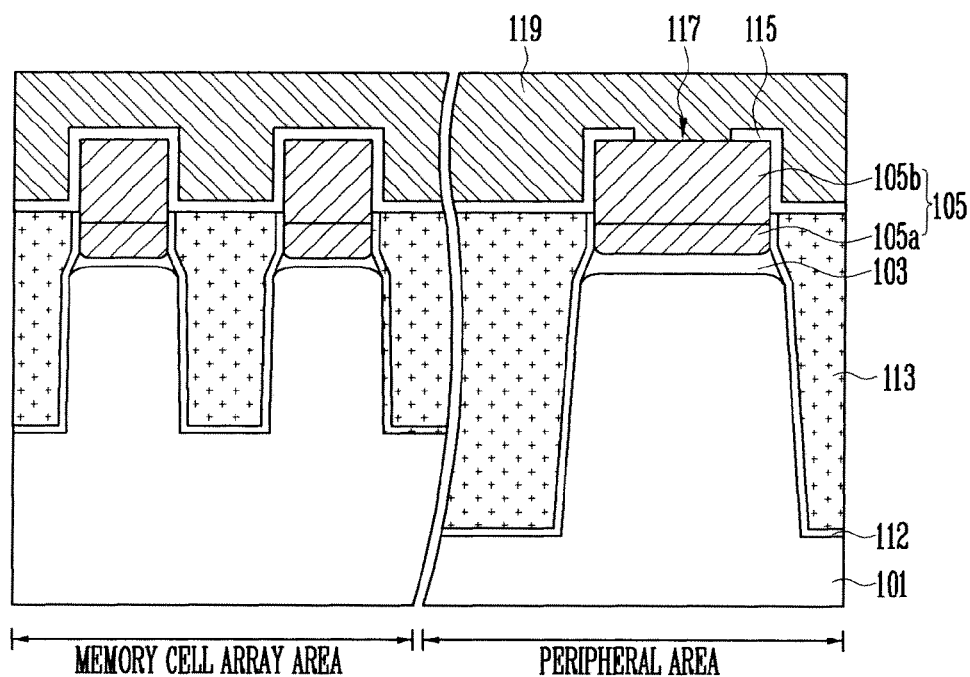

Referring to FIG. 2H, after the sidewall oxide layer 112 is formed, an insulating material is deposited to a sufficient thickness to fill the trenches 111. Next, a polishing process is performed to expose the isolation hard mask patterns (refer to 107 of FIG. 2G), thereby forming isolation layers 113 in the trenches 111. The polishing process preferably is performed using a chemical mechanical polishing (CMP) process. In particular, the auxiliary layer (refer to 107a of FIG. 2G), preferably comprising a nitride layer, from among the isolation hard mask pattern (refer to 107 of FIG. 2E), can function to stop the polishing process performed in order form the isolation layers 113. The auxiliary layer (refer to 107a of FIG. 2G) is removed after the polishing process is performed.

Next, the effective field oxide height (EFH) is controlled by lowering the height of the isolation layers 113 through a fourth etch process, such as an etch-back process. Here, the top height of the isolation layers 113 preferably is lower than the top height of the first conductive layer 105, but higher than the top height of the gate insulating layer 103.

Next, a dielectric layer 115 is formed on a surface of the isolation layers 113 and the first conductive layer 105. The dielectric layer 115 preferably includes a gate contact hole 117 through which the first conductive layer 105 is exposed. In particular, the gate contact hole 117 preferably is formed to expose the first conductive layer 105 forming a circuit element of the peripheral area.

Next, a second conductive layer 119 is formed on the dielectric layer 115 including the gate contact hole 117. The second conductive layer 119 is used as a conductive layer for a control gate. The second conductive layer 119 can be electrically coupled to the first conductive layer 105 through the gate contact hole 117.

As described above, in accordance with the disclosure, before the trenches 111 are formed after the semiconductor substrate 101 is exposed by performing the process of etching the gate insulating layer 103, the second passivation layer 109 is formed on the sidewalls of the first conductive layer 105 and on the sidewalls of the gate insulating layer 103. The second passivation layer 109 functions to compensate for the first passivation layer damaged when the gate insulating layer 103 is etched. Therefore, the second passivation layer 109 can prevent the sidewalls of the first conductive layer 107 from being excessively etched. Furthermore, the second passivation layer 109 can prevent the sidewalls of the gate insulating layer 103 from being etched. Accordingly, the second passivation layer 109 of the disclosure can prevent device defects occurring because of the excessively etched sidewalls of the first conductive layer 107. Furthermore, the second passivation layer 109 can improve the leakage current occurring at the edges of the gate insulating layer 103 because the sidewalls of the gate insulating layer 103 are etched and so the edges of the gate insulating layer 103 become thin.

In accordance with the disclosure, during the time for which the etch process for forming the trenches is performed, the sidewalls of the first conductive layer are protected by the passivation layer. Accordingly, the sidewalls of the first conductive layer used as a charge trap layer can be prevented from being excessively etched. Consequently, the disclosure can prevent a device failure occurring because of the excessively etched sidewalls of the first conductive layer.

Furthermore, in accordance with the disclosure, during the time for which the etch process for forming the trenches is performed, the sidewalls of the gate insulating layer are protected by the passivation layer. Accordingly, a phenomenon in which the edges of the gate insulating layer are etched and thinned can be prevented. Consequently, the disclosure can improve the leakage current occurring because of the thin edges of the gate insulating layer and so the data retention characteristic of a device.

What is claimed is:

1. A method of forming a nonvolatile memory device, the method comprising:
    forming a gate insulating layer over a semiconductor substrate;
    forming conductive patterns over the gate insulating layer, the conductive patterns defining sidewalls;
    forming gate insulating patterns by removing the gate insulating layer exposed between the conductive patterns to expose the semiconductor substrate, the gate insulating patterns defining sidewalls;
    forming a passivation layer on the sidewalls of the gate insulating patterns and on the sidewalls of the conductive patterns; and
    performing an etching process using plasma to remove an exposed portion of the semiconductor substrate for forming trenches, wherein during the etching process the passivation layer and a portion of the semiconductor substrate under the passivation layer are etched so that top edges of the trenches become round.

2. The method of claim 1, wherein:
    the semiconductor substrate comprises a memory cell array area and a peripheral area,
    the gate insulating layer is thicker in a top surface of the peripheral area than in a top surface of the memory cell array area, and
    when removing the gate insulating layer, using a thickness of the gate insulating layer formed over the peripheral area as a target.

3. The method of claim 1, comprising forming the passivation layer using an oxidization process.

4. The method of claim 3, comprising performing the oxidization process at a temperature in a range of 200° C. to 300° C.

5. The method of claim 1, comprising forming the passivation layer using $O_2$ gas.

6. The method of claim 1, comprising forming the passivation layer using a mixed gas of $O_2$ and $N_2$.

7. The method of claim 1, further comprising forming a sidewall oxide layer on a surface of the trenches using an oxidization process to remove defects occurred in the sidewalls of the trenches, after forming the trenches.

8. The method of claim 7, comprising increasing a thickness of edges of the gate insulating layer while performing the oxidation process.

9. The method of claim 1, comprising forming the passivation layer to a thickness of 20Å or more so that the conductive patterns can be prevented from being etched during etching of the semiconductor substrate, and to a thickness of 50Å or less to prevent deterioration of an electrical characteristic of the conductive patterns during an oxidization process of forming the passivation layer.

10. The method of claim 1, further comprising forming a passivation layer on the sidewalls of the conductive patterns, before removing the gate insulating layer.

11. The method of claim 10, comprising compensating for portions of the passivation layer formed before removing the gate insulating layer by the passivation layer formed after removing the gate insulating layer.

* * * * *